US012800723B2

(12) United States Patent
Iguchi et al.

(10) Patent No.: US 12,800,723 B2
(45) Date of Patent: Nov. 17, 2026

(54) LIGHT EMITTING ELEMENT ARRAY, LIGHT EMITTING DEVICE, AND DETECTION APPARATUS

(71) Applicant: FUJIFILM Business Innovation Corp., Tokyo (JP)

(72) Inventors: Daisuke Iguchi, Kanagawa (JP); Junichiro Hayakawa, Kanagawa (JP)

(73) Assignee: FUJIFILM Business Innovation Corp., Tokyo (JP)

(*) Notice: Subject to any disclaimer, the term of this patent is extended or adjusted under 35 U.S.C. 154(b) by 1035 days.

(21) Appl. No.: 17/989,707

(22) Filed: Nov. 18, 2022

(65) Prior Publication Data

US 2023/0333212 A1 Oct. 19, 2023

(30) Foreign Application Priority Data

Apr. 15, 2022 (JP) ................................ 2022-067689

(51) Int. Cl.

| | |
|---|---|
| ***G01S 7/48*** | (2006.01) |
| ***G01S 7/481*** | (2006.01) |
| ***G01S 17/10*** | (2020.01) |
| ***H01S 5/42*** | (2006.01) |

(52) U.S. Cl.

CPC ............ *G01S 7/4815* (2013.01); *G01S 17/10* (2013.01); *H01S 5/426* (2013.01)

(58) Field of Classification Search

USPC ........................................................ 356/4.01

See application file for complete search history.

(56) References Cited

U.S. PATENT DOCUMENTS

| | | | | |
|---|---|---|---|---|
| 11,092,678 | B2 | 8/2021 | Barnes et al. | |
| 2012/0274931 | A1* | 11/2012 | Otani | G01N 21/94 356/237.3 |
| 2013/0236136 | A1* | 9/2013 | Nara | G02B 6/126 385/11 |
| 2014/0192364 | A1* | 7/2014 | Yatagai | G01J 4/00 356/491 |
| 2018/0000341 | A1* | 1/2018 | Tomatsu | A61B 3/102 |
| 2018/0289251 | A1* | 10/2018 | Matsumoto | A61B 3/102 |
| 2019/0072819 | A1* | 3/2019 | Anzai | G02F 1/133536 |
| 2019/0391238 | A1* | 12/2019 | Barnes | G01S 7/4808 |

(Continued)

FOREIGN PATENT DOCUMENTS

| | | | | |
|---|---|---|---|---|
| CN | 101349757 | A * | 1/2009 | |
| CN | 109164456 | A * | 1/2019 | G01S 17/10 |
| EP | 3809157 | A1 * | 4/2021 | G01S 17/10 |

(Continued)

OTHER PUBLICATIONS

"Notice of reasons for refusal Counterpart Application", issued on Mar. 3, 2026, with English translation thereof, pp. 1-8.

*Primary Examiner* — James R Hulka
(74) *Attorney, Agent, or Firm* — JCIPRNET

(57) ABSTRACT

A light emitting element array includes: plural light emitting elements, in which, among polarization components of light emitted by the light emitting element capable of causing interference of emitted light, light intensity of a polarization component of light in a second direction intersecting with a first direction in which light emitting elements capable of causing the interference of the light are arranged is smaller than light intensity of a polarization component in the first direction.

18 Claims, 10 Drawing Sheets

(56) References Cited

U.S. PATENT DOCUMENTS

2023/0168365 A1* 6/2023 Voormansik ........ G01S 13/9076
342/25 C

FOREIGN PATENT DOCUMENTS

| | | | | |
|---|---|---|---|---|
| JP | 2011066125 | | | 3/2011 |
| JP | 2012078200 | A | * | 4/2012 |
| JP | 2013058687 | | | 3/2013 |
| JP | 5776825 | | | 9/2015 |
| JP | 2019219400 | | | 12/2019 |

* cited by examiner

LIGHT EMITTING ELEMENT ARRAY, LIGHT EMITTING DEVICE, AND DETECTION APPARATUS

CROSS-REFERENCE TO RELATED APPLICATIONS

This application is based on and claims priority under 35 USC 119 from Japanese Patent Application No. 2022-067689 filed Apr. 15, 2022.

BACKGROUND

(i) Technical Field

The present disclosure relates to a light emitting element array and a detection apparatus.

(ii) Related Art

JP2019-219400A discloses a method of measuring a depth that is insensitive to damaged light due to in-plane reflection. The method includes causing a light source to radiate light to a scene, performing damaged light measurement by controlling a first charge storage unit of a pixel to collect charges based on light hit on the pixel during a first period in which the damaged light hits the pixel, but light returning from an object within the field of view of the pixel does not hit the pixel, removing a contribution from the damaged light from one or more measurements affected by the damaged light, based on the damaged light measurement, and determining the depth based on the one or more measurements in which the contribution from the damaged light has been removed.

SUMMARY

Aspects of non-limiting embodiments of the present disclosure relate to a light emitting element array, a light emitting device, and a detection apparatus capable of suppressing interference of light due to multipath as compared to a case where a polarization component of light emitted from a plurality of light emitting elements is not considered.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light emitting element array including: a plurality of light emitting elements, in which, among polarization components of light emitted by the light emitting element capable of causing interference of emitted light, light intensity of a polarization component of light in a second direction intersecting with a first direction in which light emitting elements capable of causing the interference of the light are arranged is smaller than light intensity of a polarization component in the first direction.

BRIEF DESCRIPTION OF THE DRAWINGS

Exemplary embodiment(s) of the present invention will be described in detail based on the following figures, wherein.

DETAILED DESCRIPTION

Figure 1:
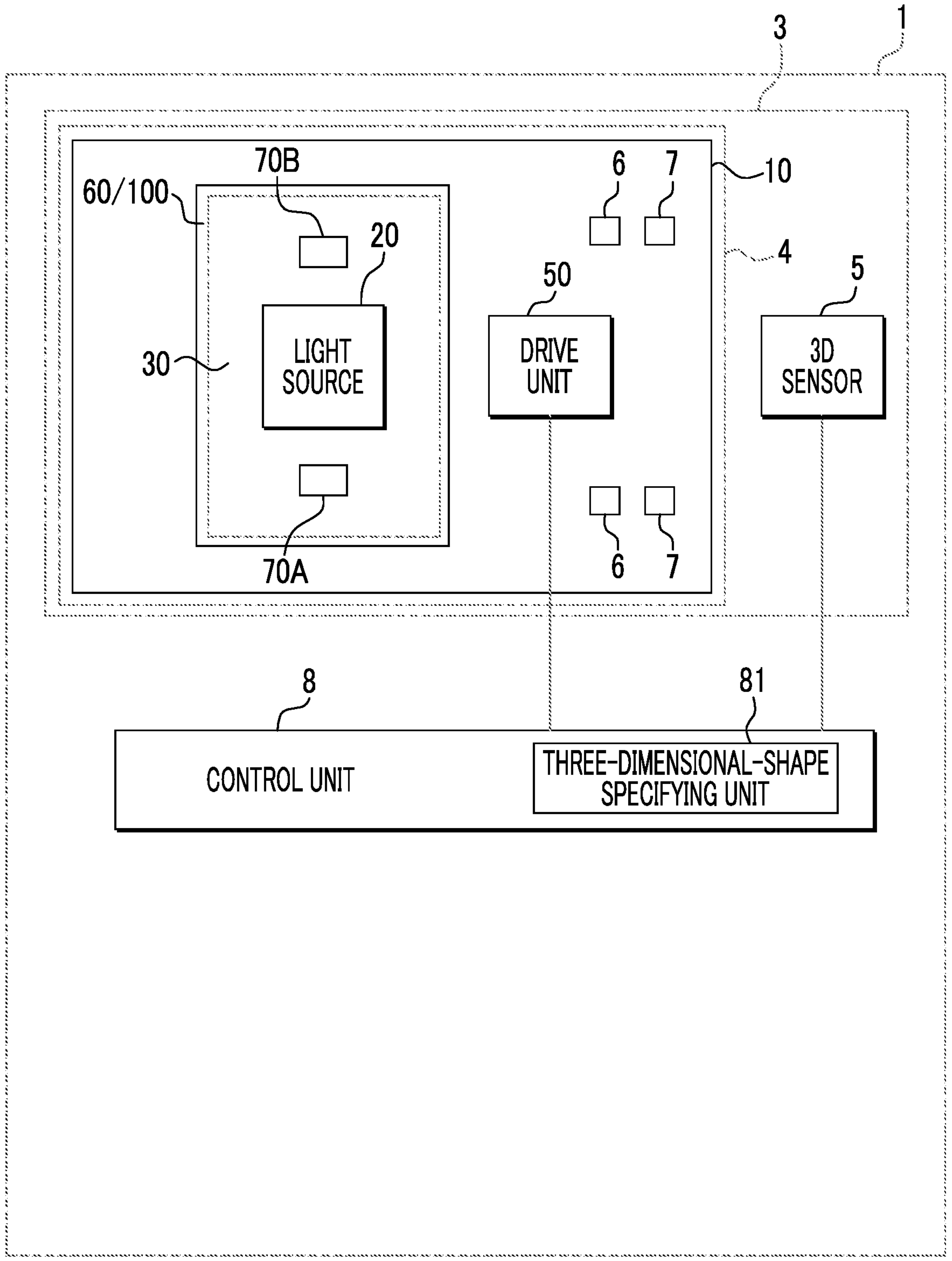
FIG. 1 is a schematic configuration diagram illustrating a configuration of a measurement apparatus.

Hereinafter, examples of exemplary embodiments according to the technique of the present disclosure will be described in detail with reference to the drawings.

First Exemplary Embodiment

As a measurement apparatus that measures the three-dimensional shape of a measurement target, there is an apparatus that measures the three-dimensional shape based on the so-called time-of-flight (ToF) method which is based on the time of flight of light. In the ToF method, a time from a timing at which light is emitted from a light source in the measurement apparatus to a timing at which light with which irradiation is performed is reflected by the measurement target, and then is received by a three-dimensional sensor (referred to as a 3D sensor below) in the measurement apparatus is measured, and the distance to the measurement target is measured. In this manner, the three-dimensional shape is specified. A target for measuring the 3D shape is referred to as the measurement target. The measurement target is an example of a detection target object. Measurement of a three-dimensional shape may be referred to as "three-dimensional measurement", "3D measurement", or "3D sensing".

The ToF method includes a direct method and a phase difference method (indirect method). The direct method is a method of irradiating a measurement target with pulsed light emitted for a very short time, and actually measuring a time until the light is returned. The phase difference method is a method of periodically flickering pulsed light and detecting, as a phase difference, a time delay when a plurality of rays of pulsed light travel back and forth to and from a measurement target. In the present exemplary embodiment, a three-dimensional shape is measured by the phase difference method as an example.

Such a measurement apparatus is mounted in a portable information processing apparatus or the like, and is used for face authentication of a user who intends to perform an access. In the related art, in the portable information processing apparatus and the like, a method of authenticating a user by using a password, fingerprint, iris, or the like is used. In recent years, there has been a demand for an authentication method with higher security. Therefore, a measurement apparatus that measures a three-dimensional shape has been mounted in the portable information processing apparatus. That is, the measurement apparatus acquires a three-dimensional image of the face of a user who has performed an access, and identifies whether or not the access is permitted. Only in a case where the user is authenticated to have the permitted access, the measurement apparatus permits the use of the own apparatus (portable information processing apparatus).

In addition, such a measurement apparatus is also applied to a case of continuously measuring the three-dimensional shape of a measurement target, such as in augmented reality (AR).

The configurations, functions, methods, and the like described in the present exemplary embodiment described below can be applied not only to face authentication and augmented reality, but also to measurement of the three-dimensional shape of other measurement targets.

Measurement Apparatus 1

FIG. 1 is a block diagram illustrating an example of a configuration of a measurement apparatus 1 that measures a three-dimensional shape.

The measurement apparatus 1 includes an optical device 3 and a control unit 8. The control unit 8 controls the optical device 3. The control unit 8 includes a three-dimensional-shape specifying unit 81 that specifies the three-dimensional shape of a measurement target. The measurement apparatus 1 is an example of a detection apparatus. The control unit 8 is an example of a detection unit.

Figure 2:
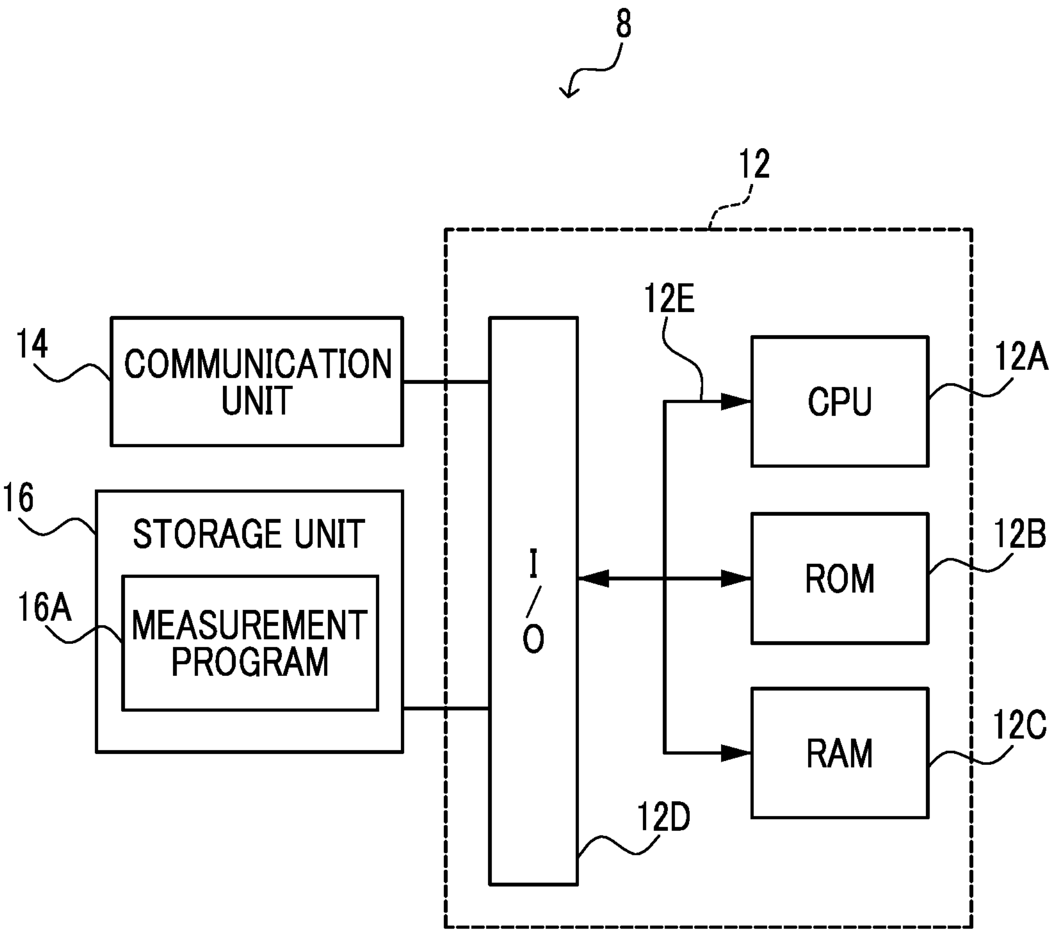
FIG. 2 is a block diagram illustrating a basic configuration of an electrical system in the measurement apparatus.

FIG. 2 is a block diagram illustrating a hardware configuration of the control unit 8. As illustrated in FIG. 2, the control unit 8 includes a controller 12. The controller 12 includes a central processing unit (CPU) 12A, a read only memory (ROM) 12B, a random access memory (RAM) 12C, and an input and output interface (I/O) 12D. The CPU 12A, the ROM 12B, the RAM 12C, and the I/O 12D are connected via a system bus 12E. The system bus 12E includes a control bus, an address bus, and a data bus.

A communication unit 14 and a storage unit 16 are connected to the I/O 12D.

The communication unit 14 is an interface for performing data communication with an external device.

The storage unit 16 is configured by a non-volatile rewritable memory such as a flash ROM or the like, and stores a measurement program 16A and the like, which will be described later. The three-dimensional-shape specifying unit 81 is configured and the three-dimensional shape of a measurement target is specified, in a manner that the CPU 12A reads the measurement program 16A stored in the storage unit 16 into the RAM 12C and executes the measurement program 16A.

The optical device 3 includes a light emitting device 4 and a 3D sensor 5. The light emitting device 4 includes a wiring board 10, a heat dissipation base material 100, a light source 20, a light diffusion member 30, a drive unit 50, a retention unit 60, and capacitors 70A and 70B. Furthermore, the light emitting device 4 may include passive elements such as a resistive element 6 and a capacitor 7 in order to operate the drive unit 50. Here, it is assumed that two resistive elements 6 and two capacitors 7 are provided. Although two capacitors 70A and 70B are illustrated, one capacitor may be provided. The capacitors 70A and 70B are referred to as a capacitor 70 in a case where the capacitors 70A and 70B are not distinguished from each other. One or a plurality of resistive elements 6 and one or a plurality of capacitors 7 may be provided. Here, electrical components such as the 3D sensor 5, the resistive element 6, and the capacitor 7 other than the light source 20, the drive unit 50, and the capacitor 70 may be referred to as circuit components without distinguishing the above electrical components from each other. The capacitor may be referred to as a capacitor. The 3D sensor 5 is an example of a light receiving unit.

The heat dissipation base material 100, the drive unit 50, the resistive element 6, and the capacitor 7 in the light emitting device 4 are provided on the front surface of the wiring board 10. Although the 3D sensor 5 is not provided on the front surface of the wiring board 10 in FIG. 1, the 3D sensor 5 may be provided on the front surface of the wiring board 10.

The light source 20, the capacitors 70A and 70B, and the retention unit 60 are provided on the front surface of the heat dissipation base material 100. The light diffusion member 30 is provided above the retention unit 60. Here, it is assumed that the outer shape of the heat dissipation base material 100 and the outer shape of the light diffusion member 30 are the same as each other. Here, the front surface means the front side of the paper surface of FIG. 1. More specifically, the side on which the heat dissipation base material 100 is provided in the wiring board 10 is referred to as the front surface, the front side, or the front surface side. The side on which the light source 20 is provided in the heat dissipation base material 100 is referred to as the front surface, the front side, or the front surface side.

The light source 20 is configured as a light emitting element array in which a plurality of light emitting elements are two-dimensionally arranged (see FIG. 3 described later). The light emitting element is, for example, a vertical cavity surface emitting laser element VCSEL. The description will be made below on the assumption that the light emitting element is a vertical cavity surface emitting laser element VCSEL. In the following description, the vertical cavity surface emitting laser element VCSEL may be referred to as a VCSEL. Since the light source 20 is provided on the front surface of the heat dissipation base material 100, the light source 20 emits light in a direction that is perpendicular to the front surface of the heat dissipation base material 100 and is away from the heat dissipation base material 100. That is, the light emitting element array is a surface emitting laser element array. A plurality of light emitting elements in the light source 20 are two-dimensionally arranged, and the surface of the light source 20 from which light is emitted may be referred to as an emission surface.

The light emitted from the light source 20 is incident on the light diffusion member 30. The light diffusion member 30 diffuses and emits the incident light. The light diffusion member 30 is provided to cover the light source 20 and the capacitors 70A and 70B. That is, the light diffusion member 30 is provided at a predetermined distance from the light source 20 and the capacitors 70A and 70B provided on the heat dissipation base material 100, by the retention unit 60 provided on the front surface of the heat dissipation base material 100. Thus, the light emitted from the light source 20 is diffused by the light diffusion member 30 and applied to the measurement target. In other words, the light emitted from the light source 20 is diffused by the light diffusion member 30 and applied in a wider range than a range in a case where the light diffusion member 30 is not provided.

In a case where three-dimensional measurement is performed by the ToF method, the drive unit 50 requires the light source 20 to emit pulsed light (referred to as emitted light pulse below) having a frequency of 100 MHz or more and a rising time of 1 ns or less, for example. In the case of face authentication as an example, the distance at which irradiation with light is performed is about 10 cm to 1 m. The range in which irradiation with light is performed is about 1 m square. The distance at which irradiation with light is performed is referred to as a measurement distance, and the range in which irradiation with light is performed is referred to as an irradiation range or a measurement range. A surface virtually provided in the irradiation range or the measurement range is referred to as an irradiation surface. The measurement distance to the measurement target and the irradiation range of the measurement target may be other than the measurement distance and the irradiation range described above, such as in cases other than face authentication.

The 3D sensor 5 includes a light receiving element array including a plurality of light receiving elements, and outputs a signal corresponding to the time from a timing at which light is emitted from the light source 20 to a timing at which the 3D sensor 5 receives the light.

For example, each light receiving element of the 3D sensor 5 receives pulse-shaped reflected light (referred to as a received light pulse below) from the measurement target with respect to the emitted light pulse from the light source 20. In addition, each light receiving element accumulates charges corresponding to the time until the light is received. The 3D sensor 5 is configured as a CMOS device in which each light receiving element includes two gates and corresponding charge accumulation units. By alternately applying pulses to the two gates, the generated photoelectrons are transferred to either of the two charge accumulation units at a high speed. Charges corresponding to the phase difference between the emitted light pulse and the received light pulse are accumulated in the two charge accumulation units. The 3D sensor 5 outputs, as a signal, a digital value corresponding to the phase difference between the emitted light pulse and the received light pulse for each light receiving element via an AD converter. That is, the 3D sensor 5 outputs a signal corresponding to the time from the timing at which the light source 20 emits the light to the timing at which the 3D sensor 5 receives the light. That is, a signal corresponding to the three-dimensional shape of the measurement target is obtained from the 3D sensor 5. The AD converter may be provided in the 3D sensor 5 or may be provided outside the 3D sensor 5.

The control unit 8 turns on a switch element SW and drives the drive unit 50 to cause the light source 20 to emit light, irradiate the measurement target with light, and cause the 3D sensor 5 to receive the reflected light from the measurement target. The three-dimensional shape of the measurement target is measured from the amount of light received by the 3D sensor 5 by using the ToF method.

The light source 20, the light diffusion member 30, the drive unit 50, and the capacitors 70A and 70B, which constitute the light emitting device 4, will be described below.

Configuration of Light Source 20

Figure 3:
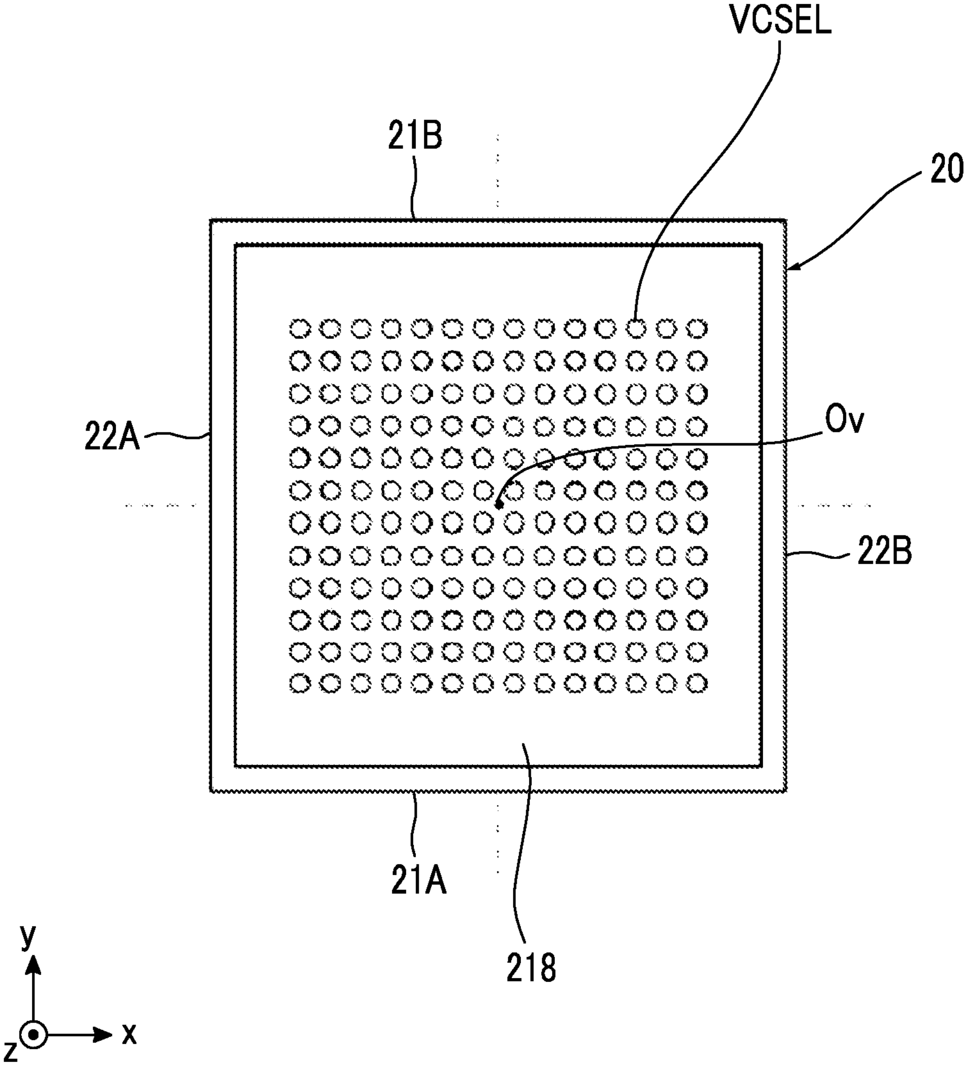
FIG. 3 is a plan view illustrating a light source.

FIG. 3 is a plan view of the light source 20. The light source 20 is configured by arranging a plurality of VCSELs in a two-dimensional array. That is, the light source 20 is configured as a light emitting element array using VCSELs as light emitting elements. The right direction of the paper is defined as an x-direction, and the upper direction of the paper surface is defined as a y-direction.

A direction perpendicular to the x-direction and the y-direction is defined as the z-direction. The front surface of the light source 20 refers to the front side of the paper surface, that is, the surface on the +z direction side. The back surface of the light source 20 refers to the back side of the paper surface, that is, the surface on the −z direction side. The plan view of the light source 20 is a view of the light source 20 viewed from the front surface side.

More specifically, in the light source 20, the side on which an epitaxial layer that functions as a light emitting layer (active region 206 described later) is formed is referred to as the front surface, the front side, or the front surface side of the light source 20.

The VCSEL is a light emitting element in which an active region as a light emission region is provided between a lower multilayer reflection mirror and an upper multilayer reflection mirror stacked on a semiconductor substrate, and laser light is emitted in a direction perpendicular to the front surface. Therefore, the VCSEL is easier to form a two-dimensional array as compared to the case using edge emitting laser. The number of VCSELs included in the light source 20 is, for example, 100 to 1000. A plurality of VCSELs are connected in parallel and driven in parallel. The above number of VCSELs is an example, and may be set in accordance with the measurement distance and the irradiation range.

An anode electrode 218 (see FIG. 4) common to a plurality of VCSELs is provided on the front surface of the light source 20. A cathode electrode 214 (see FIG. 4) is provided on the back surface of the light source 20. That is, the plurality of VCSELs are connected in parallel. By connecting and driving a plurality of VCSELs in parallel, light having higher intensity is emitted than intensity in a case where the VCSELs are driven individually.

Here, it is assumed that a shape (referred to as a planar shape, and the same applies below) of the light source 20 viewed from the front surface side) is a rectangle. The side surface on the −y direction side is referred to as a side surface 21A, the side surface on the +y direction side is referred to as a side surface 21B, the side surface on the −x direction side is referred to as a side surface 22A, and the side surface on the +x direction side is referred to as a side surface 22B. The side surface 21A faces the side surface 21B. The side surfaces 22A and 22B connect the side surfaces 21A and 21B and face each other.

The center of the planar shape of the light source 20, that is, the center in the x-direction and the y-direction is defined as a center Ov.

Drive Unit 50 and Capacitors 70A and 70B

In a case where the light source 20 is intended to be driven at a higher speed, low-side driving is favorable, for example. The low-side driving refers to a configuration in which a drive element such as a MOS transistor is located on the downstream side of a current path with respect to a drive target such as the VCSEL. Conversely, a configuration in which the drive element is located on the upstream side is referred to as high-side driving.

Figure 4:
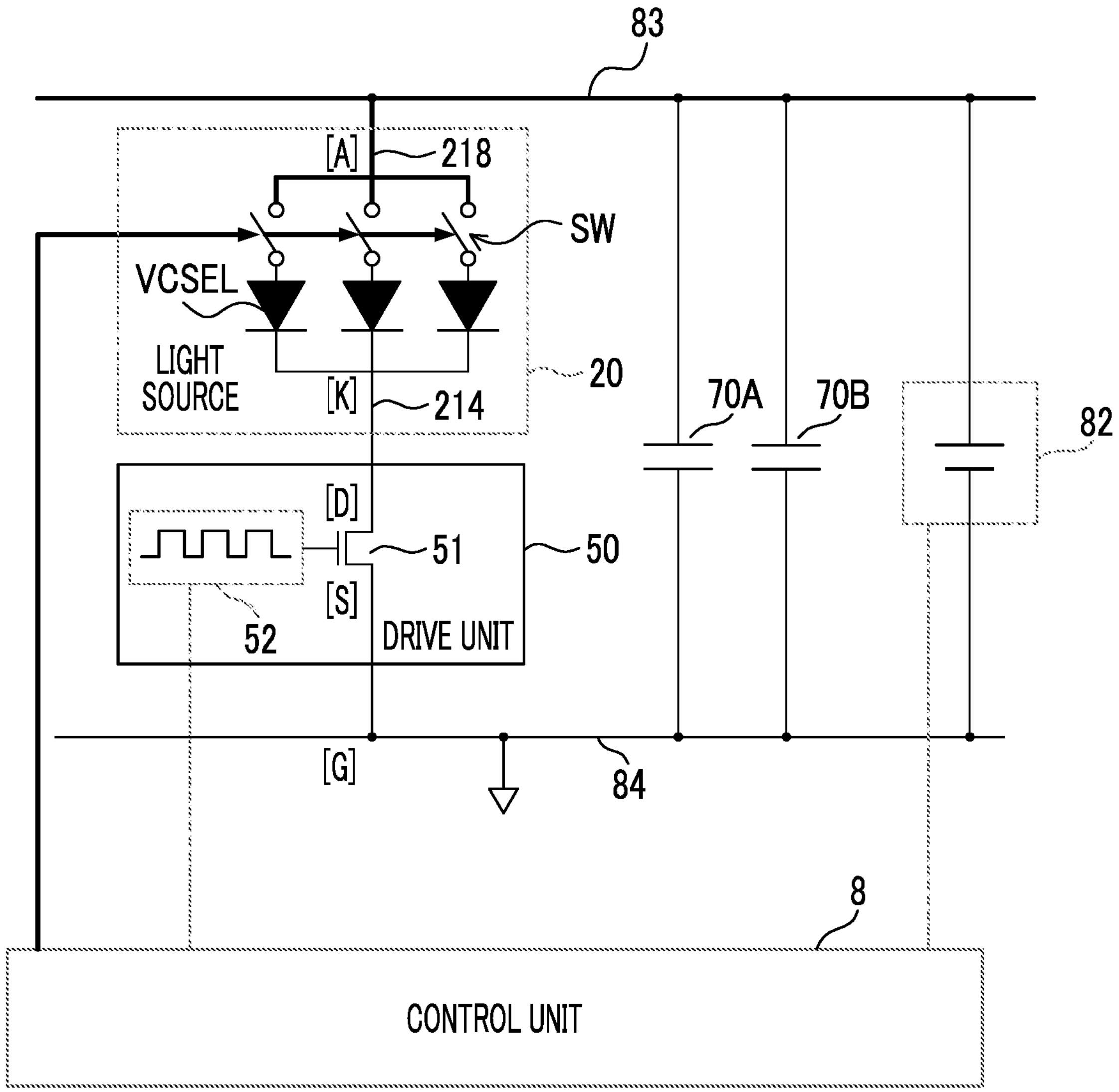
FIG. 4 is a circuit diagram illustrating the measurement apparatus.

FIG. 4 is a diagram illustrating an example of an equivalent circuit in a case where the light source 20 is driven by the low-side driving. FIG. 4 illustrates the VCSEL of the light source 20, the drive unit 50, the capacitors 70A and 70B, and a power supply 82. The power supply 82 is provided in the control unit 8 illustrated in FIG. 1. The power supply 82 generates a DC voltage having a power supply potential on the + side and a reference potential on the − side. The power supply potential is supplied to a power supply line 83, and the reference potential is supplied to a reference line 84. The reference potential may be referred to as a ground potential (may be referred to as GND. In FIG. 4, denoted as [G]).

The light source 20 is configured by connecting a plurality of VCSELs in parallel as described above. The anode electrode 218 (see FIG. 3. In FIG. 4, denoted as [A]) of the VCSEL is connected to the power supply line 83.

As illustrated in FIG. 4, the switch element SW is provided between each VCSEL and the power supply line 83, and each switch element SW is driven by a command from the control unit 8. In a case where each VCSEL is individually driven, each switch element SW is turned on and off individually. In a case where a plurality of VCSELs are simultaneously driven, the respective switch elements SW corresponding to the plurality of VCSELs are simultaneously turned on and off.

The drive unit 50 includes an n-channel MOS transistor 51 and a signal generation circuit 52 that turns the MOS transistor 51 on and off. The drain (denoted as [D] in FIG. 4) of the MOS transistor 51 is connected to the cathode electrode 214 (denoted as [K] in FIG. 4) of the VCSEL. The source (denoted as [S] in FIG. 4) of the MOS transistor 51 is connected to the reference line 84. The gate of the MOS transistor 51 is connected to the signal generation circuit 52. That is, the VCSEL and the MOS transistor 51 of the drive unit 50 are connected in series between the power supply line 83 and the reference line 84. Under the control of the control unit 8, the signal generation circuit 52 generates an "H level" signal for turning on the MOS transistor 51 and an "L level" signal for turning off the MOS transistor 51.

The capacitors 70A and 70B have one terminal connected to the power supply line 83 and the other terminal connected to the reference line 84. Here, in a case where there are a plurality of capacitors 70, the plurality of capacitors 70 are connected in parallel. That is, in FIG. 4, the capacitor 70 is assumed to be two capacitors 70A and 70B. The capacitor 70 is, for example, an electrolytic capacitor or a ceramic capacitor.

Next, a method of driving the light source 20, which is low-side driving, will be described.

In a case where the control unit 8 causes the light source 20 to emit light, the control unit 8 turns on the switch element SW.

First, it is assumed that a signal generated by the signal generation circuit 52 in the drive unit 50 has an "L level". In this case, the MOS transistor 51 is in an off state. That is, no current flows between the source ([S] in FIG. 4) and the drain ([D] in FIG. 4) of the MOS transistor 51. Thus, no current flows through the VCSEL connected in series with the MOS transistor 51. That is, the VCSEL is in a non-emissive state.

At this time, the capacitors 70A and 70B are connected to the power supply 82, one terminals of the capacitors 70A and 70B connected to the power supply line 83 have the power supply potential, and the other terminals connected to the reference line 84 have the reference potential. Therefore, the capacitors 70A and 70B are charged by a current flowing from the power supply 82 (charges are supplied).

Then, in a case where the signal generated by the signal generation circuit 52 in the drive unit 50 becomes an "H level", the MOS transistor 51 is turned on from the off state. Then, the capacitors 70A and 70B, and the MOS transistor 51 and the VCSEL connected in series form a closed loop. The charges accumulated in the capacitors 70A and 70B are supplied to the MOS transistor 51 and the VCSEL connected in series. In other words, a drive current flows through the VCSEL, and the VCSEL emits light. This closed loop corresponds to a drive circuit that drives the light source 20.

In a case where the signal generated by the signal generation circuit 52 in the drive unit 50 becomes an "L level" again, the MOS transistor 51 shifts from the ON state to the OFF state. As a result, the closed loop (drive circuit) of the capacitors 70A and 70B, and the MOS transistor 51 and the VCSEL connected in series becomes an open loop, and no drive current flows through the VCSEL. This causes the VCSEL to stop light emission. Then, charges from the power supply 82 to the capacitors 70A and 70B, and the capacitors 70A and 70B are charged.

As described above, the MOS transistor 51 repeats on and off, and the VCSEL repeats light emission and non-light emission, each time the signal output from the signal generation circuit 52 shifts between an "H level" and an "L level". The repetition of turning on and off of the MOS transistor 51 may be referred to as switching.

In the present exemplary embodiment, it is assumed that the light receiving element PD that receives the light emitted by each VCSEL is specified in advance. That is, the light emitted from a plurality of VCSELs is received by the corresponding light receiving element PD. Here, the VCSEL and the light receiving element PD may have a correspondence of any one of one-to-one, many-to-one, one-to-many, and many-to-many. To simplify the description, the case where the VCSEL and the light receiving element PD are in one-to-one correspondence will be described below.

Figure 5:
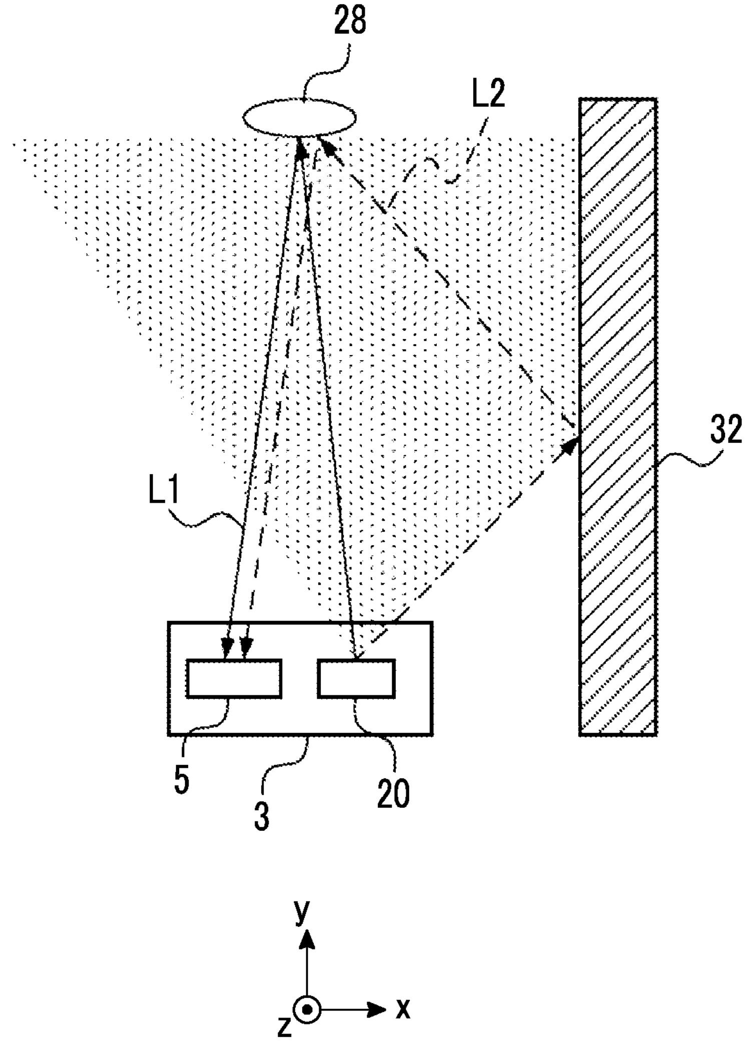
FIG. 5 is a diagram illustrating multipath.

In a case where the distance to the measurement target is measured by irradiating the measurement target with light from the light source 20, and receiving the reflected light, there is a problem that light interference due to multipath may occur. For example, as illustrated in FIG. 5, the light emitted from the light source 20 is not only direct light L1 that is directly incident on the measurement target 28 and reflected. For example, the light may be reflected by an obstacle such as a wall 32 and may be received by the 3D sensor 5 as multipath light L2 following a plurality of paths. Multipath causes the light receiving element to receive not only direct light but also indirect light that is not to be received, which may affect the accuracy of the measured distance.

Here, regarding the interference of light due to multipath, light specularly reflected among rays of reflected light from the wall 32 irradiated with light, that is, light of a polarization component in the z-direction in FIG. 5 is dominant.

Therefore, in the present exemplary embodiment, the light source 20 is set to have a configuration in which, among polarization components of light emitted by a VCSEL capable of causing the interference of the emitted light, light intensity of the polarization component of light in a second direction intersecting with a first direction in which VCSELs capable of causing the interference of light are arranged is smaller than light intensity of the polarization component in the first direction.

Figure 6:
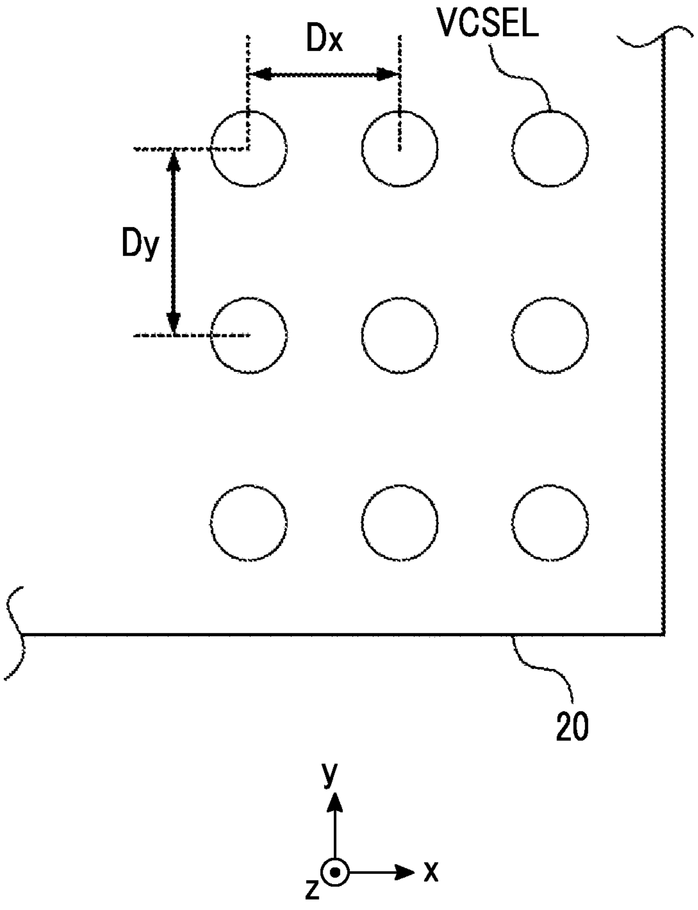
FIG. 6 is a diagram illustrating a polarization component of a VCSEL.

For example, as illustrated in FIG. 6, the distance between VCSELs equally spaced in the x-axis direction is set as Dx, the distance between VCSELs equally spaced in the y-axis direction is set as Dy, and $Dx<Dy$ is set to be satisfied. In this case, the probability that the interference of light occurs between VCSELs arranged in the x-axis direction may be higher than the probability the interference of light occurs between VCSELs arranged in the y-axis direction. As described above, the light source 20 is configured by a plurality of VCSELs having a polarization direction that is controlled so that, in a case where the distance between the VCSELs capable of causing the interference of the emitted light, that is, the distance between the VCSELs arranged in the x-axis direction is shorter than the distance between the VCSELs other than the VCSELs capable of causing the interference of the light, that is, the VCSELs arranged in the y-axis direction, the light intensity of the polarization component in the y-axis direction (second direction) is smaller than the light intensity of the polarization component in the x-axis direction (first direction).

As a method of controlling the polarization direction of the VCSEL, for example, the methods disclosed in References 1 to 3 below can be used, but the present disclosure is not limited to the methods.

(Reference 1) JP5776825B (Reference 2) JP2011-66125A (Reference 3) JP2013-58687A As described above, in the light source 20, the polarization direction is controlled so that the light intensity of the polarization component in the y-axis direction, in which the VCSELs capable of causing the interference of light are arranged, is smaller than the light intensity of the polarization component in the x-axis direction. Therefore, the interference of light due to multipath is suppressed as compared to the case where the polarization component of the emitted light is not considered.

Second Exemplary Embodiment

Next, a second exemplary embodiment will be described.

In the second exemplary embodiment, a case where a VCSEL capable of causing interference of emitted light is a VCSEL other than a VCSEL being a control target in which the interference of the emitted light is to be suppressed.

Figure 7:
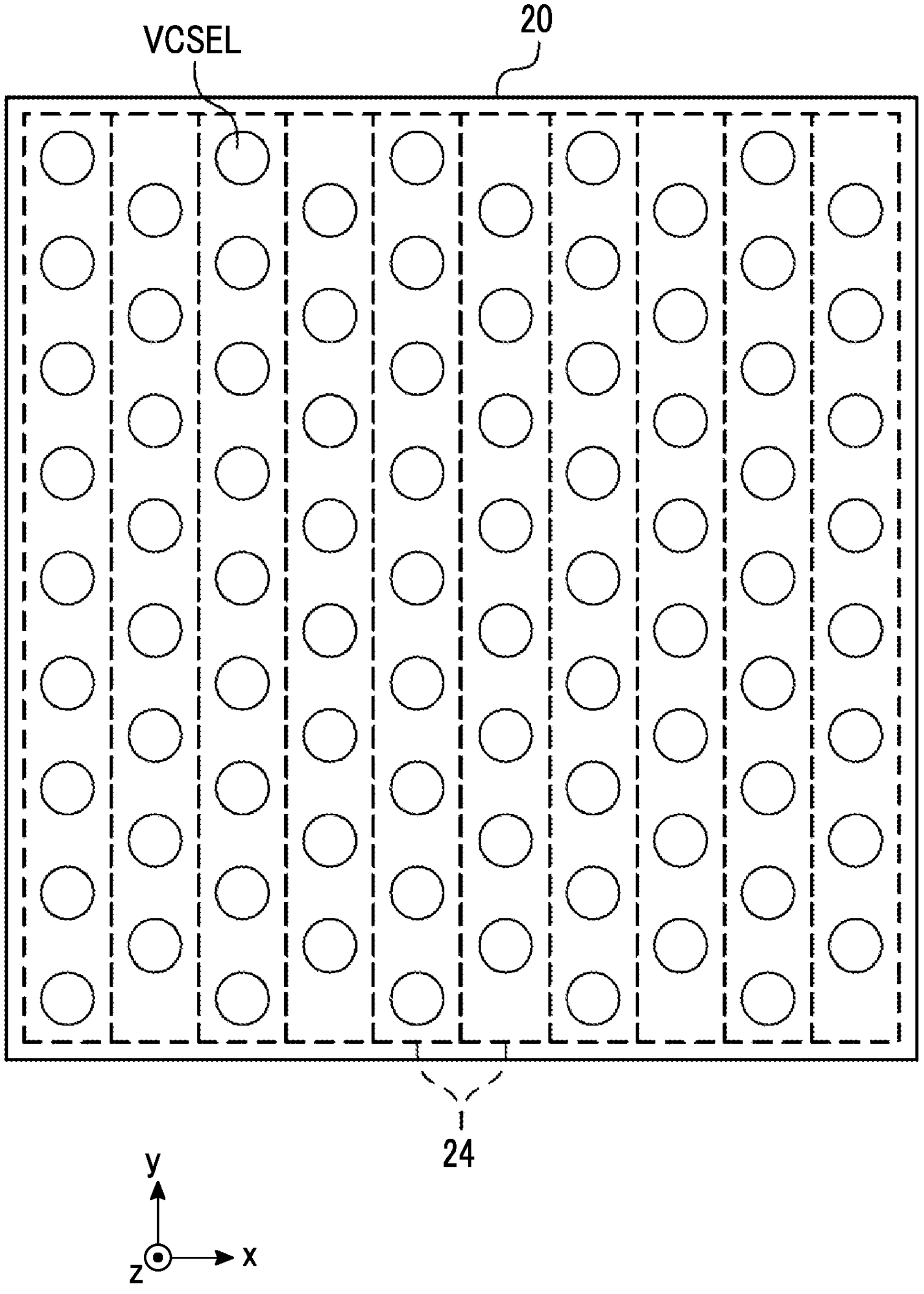
FIG. 7 is a diagram illustrating a polarization component of a VCSEL.

For example, as illustrated in FIG. 7, the light source 20 may be divided into a plurality of banks (light emission sections) 24, and light may be emitted sequentially in each bank. In the example of FIG. 7, in one bank 24, a plurality of VCSELs are arranged in the y-axis direction. In this case, the plurality of VCSELs provided in one bank 24 are driven simultaneously. The VCSELs in each bank 24 are sequentially driven in the x-axis direction.

That is, the drive unit 50 drives the plurality of VCSELs so that, among the plurality of VCSELs arranged in the y-axis direction (first direction) and the x-axis direction (second direction), the VCSELs arranged in the y-axis direction emit light at the same light emission timing, and the VCSELs arranged in the x-axis direction emit light at different timings.

In the case of the second exemplary embodiment, the VCSELs capable of causing the interference of the emitted light are the VCSELs arranged in the y-axis direction, and the VCSELs arranged in the x-axis direction are the control target in which the interference of the emitted light is to be suppressed. Therefore, the light source 20 is configured by the plurality of VCSELs having the polarization direction that is controlled such that the light intensity of the polarization component in the x-axis direction is smaller than the light intensity of the polarization component in the y-axis direction.

Figure 8:
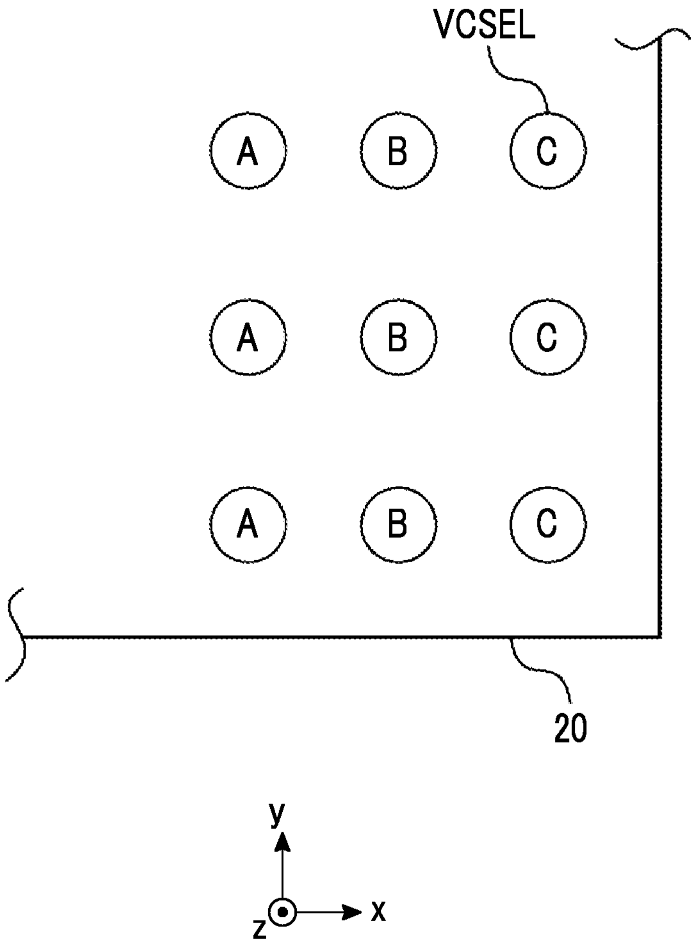
FIG. 8 is a diagram illustrating a polarization component of a VCSEL.

As illustrated in FIG. 8, the light source 20 may have a configuration in which, among the plurality of VCSELs arranged in the y-axis direction and the x-axis direction, the VCSELs arranged in the y-axis direction emit light of the same wavelength A, and the VCSELs arranged in the x-axis direction emits light of different wavelengths B and C, and all VCSELs may be simultaneously driven.

Figure 9:
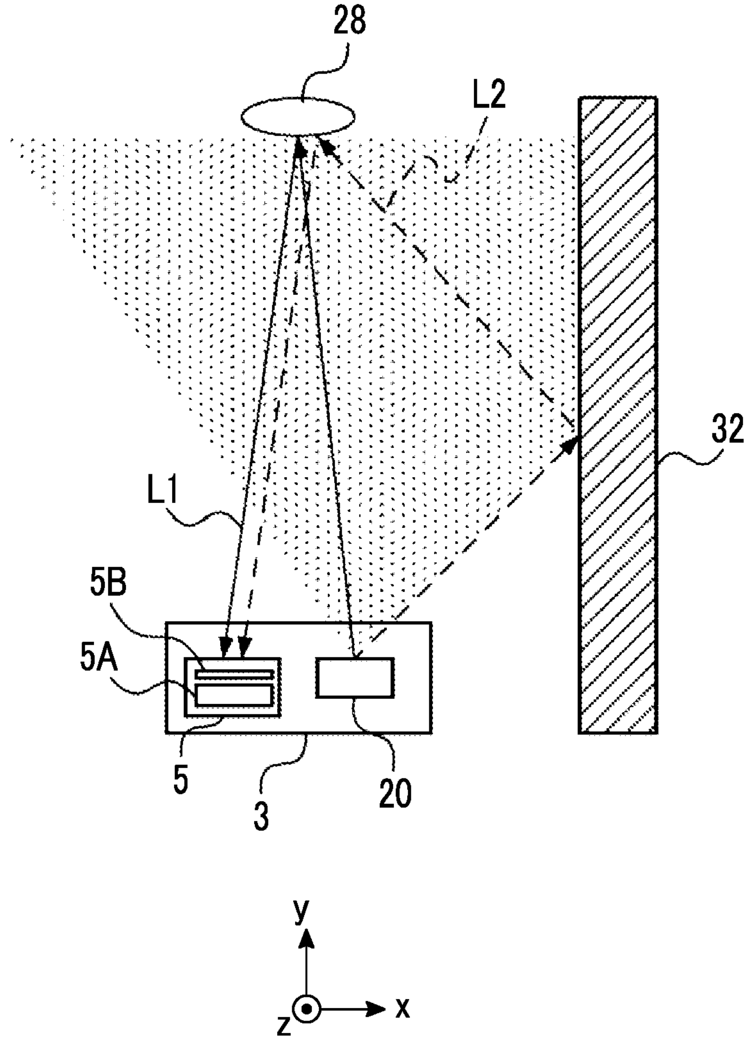
FIG. 9 is a diagram illustrating a light receiving unit including a bandpass filter.

In this case, as illustrated in FIG. 9, the 3D sensor 5 is configured to include a light receiving element array 5A and a bandpass filter 5B. The light receiving element array 5A includes a plurality of light receiving elements, and outputs a signal corresponding to the time from a timing at which light is emitted from the light source 20 to a timing at which the 3D sensor 5 receives the light.

The bandpass filter 5B transmits reflected light of different wavelengths A to C reflected from the measurement target, in accordance with the arrangement pattern of the VCSELs of the wavelengths A to C. That is, in the bandpass filter 5B, a filter that transmits light having a wavelength A, a filter that transmits light having a wavelength B, and a filter that transmits light having a wavelength C are the bandpass filters arranged in the same pattern as the arrangement pattern of the VCSELs of the wavelengths A to C in FIG. 8. As a result, the light receiving element array 5A receives, via the bandpass filter 5B, light of the wavelengths in the same pattern as the arrangement pattern of the VCSELs of the wavelengths A to C in FIG. 8.

In this case, the VCSELs capable of causing the interference of the emitted light are the VCSELs arranged in the y-axis direction, and the VCSELs arranged in the x-axis direction are the control target in which the interference of the emitted light is to be suppressed.

Therefore, also in this case, the light source 20 is configured by the plurality of VCSELs having the polarization direction that is controlled such that the light intensity of the polarization component in the x-axis direction is smaller than the light intensity of the polarization component in the y-axis direction.

In the example in FIG. 8, the light source 20 may be configured to include VCSELs having different drive frequencies in a case of being driven by the drive unit 50 instead of wavelengths, and all the VCSELs may be driven simultaneously. That is, a configuration in which, among the plurality of VCSELs arranged in the y-axis direction and the x-axis direction, the VCSELs arranged in the y-axis direction emit light of the same drive frequency A, and the VCSELs arranged in the x-axis direction emit light of different drive frequencies B and C may be made. In this case, the VCSELs capable of causing the interference of the emitted light are the VCSELs arranged in the y-axis direction, and the VCSELs arranged in the x-axis direction are the control target in which the interference of the emitted light is to be suppressed.

Therefore, also in this case, the light source 20 is configured by the plurality of VCSELs having the polarization direction that is controlled such that the light intensity of the polarization component in the x-axis direction is smaller than the light intensity of the polarization component in the y-axis direction.

Third Exemplary Embodiment

Next, a third exemplary embodiment will be described.

In the third exemplary embodiment, a case where a VCSEL capable of causing interference of emitted light is a VCSEL being a control target in which the interference of the emitted light is to be suppressed.

For example, in the second exemplary embodiment, as illustrated in FIG. 8, in a case where the light source 20 is configured such that, among a plurality of VCSELs arranged in the y-axis direction and the x-axis direction, the VCSELs arranged in the y-axis direction emit light of the same wavelength A, and the VCSELs arranged in the x-axis direction emit light of different wavelengths B and C, the VCSELs capable of causing the interference of the emitted light are arranged in the y-axis direction, and the VCSELs arranged in the x-axis direction are the control target in which the interference of the emitted light is to be suppressed.

However, for example, in a case where the difference in wavelength is small and the effect of suppressing interference of light between VCSELs of different wavelengths is insufficient only by changing the wavelength, the interference may be suppressed in a manner that the wavelength is more changed by changing the wavelength to suppress the interference and by adjusting the polarization component to suppress the interference. Further, for example, in a case where the distance in the x-axis direction (second direction) between the VCSELs of the wavelengths A and B is shorter than the distance in the y-axis direction (first direction) between the VCSELs of the wavelength A, the VCSEL capable of causing the interference of the emitted light may be the VCSEL arranged in the x-axis direction.

Therefore, in this case, the light source 20 is configured by the plurality of VCSELs having the polarization direction that is controlled such that the light intensity of the polarization component in the y-axis direction is smaller than the light intensity of the polarization component in the x-axis direction.

Similar to the second exemplary embodiment, in the example in FIG. 8, the light source 20 may be configured to include VCSELs of different drive frequencies instead of wavelengths. Also in this case, the VCSELs capable of causing the interference of the emitted light may be VCSELs arranged in the x-axis direction.

Similar to the second exemplary embodiment, the light source 20 may be configured to include VCSELs having different light emission timings instead of the wavelengths. Also in this case, the VCSELs in which the interference of the emitted light may occur may be VCSELs arranged in the x-axis direction.

Therefore, also in this case, the light source 20 is configured by the plurality of VCSELs having the polarization direction that is controlled such that the light intensity of the polarization component in the x-axis direction is smaller than the light intensity of the polarization component in the y-axis direction.

Fourth Exemplary Embodiment

Next, a fourth exemplary embodiment will be described. The light emission section being the control target in which the interference of light is to be suppressed, in the fourth exemplary embodiment, is not the light emission section along the first direction or the second direction. In the second exemplary embodiment and the like, the example in which the VCSEL being the control target in which the interference of the emitted light is to be suppressed is along the first direction or the second direction has been described. In the fourth exemplary embodiment, an example in which a direction in which it is not possible to divide the direction in which the polarization component is adjusted into the first direction and the second direction will be described.

In the fourth exemplary embodiment, there are other light emitting elements between which the distance is longer than a distance between the light emitting elements in which the interference of light is intended to be suppressed by adjusting the polarization component. In other words, the distance between the light emitting elements in which the interference of light is intended to be suppressed by adjusting the polarization components is shorter than the distance to at least some of the other light emitting elements.

Figure 10:
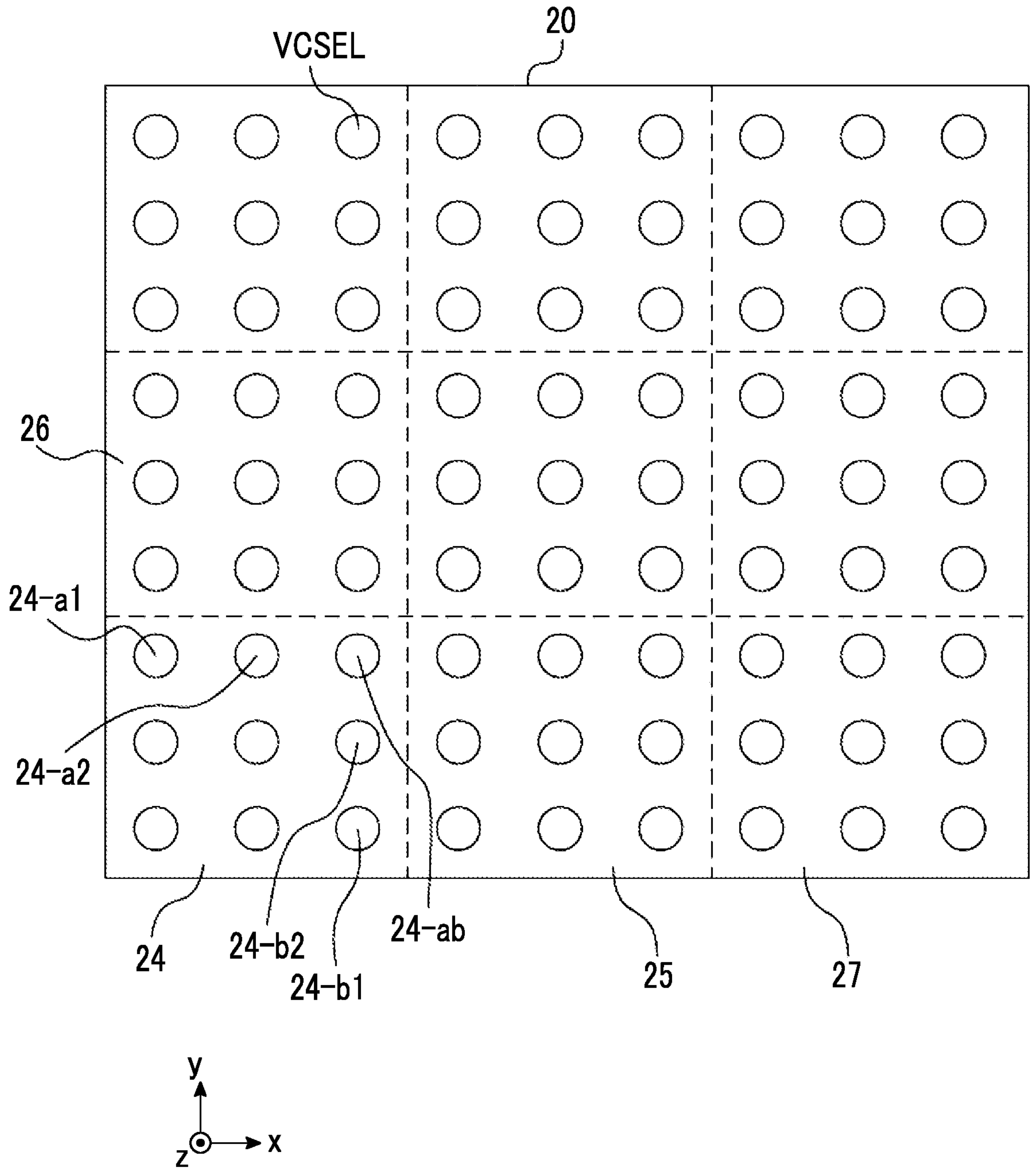
FIG. 10 is a diagram illustrating a polarization component of a VCSEL.

In the fourth exemplary embodiment, as illustrated in FIG. 10, a case where the light source 20 is configured to be divided two-dimensionally into nine sections including light emission sections 24 to 27, and a plurality of VCSELs are configured to be two-dimensionally arranged in each light emission section will be described.

In the example in FIG. 10, among the plurality of VCSELs arranged in the y-axis direction (first direction) and x-axis direction (second direction), the VCSELs provided in the same light emission section 24 emit light at the same light emission timing. Here, in the arrangement, among the VCSELs in the light emission section 24, the VCSELs that are likely to cause interference with light of the light emission section 25 are VCSELs 24-*b*1, 24-*b*2, and 24-*ab*, and the VCSELs that are likely to cause interference with light of the light emission section 26 are VCSELs 24-*a*1, 24-*a*2, and 24-*ab*. Therefore, since the VCSELs 24-*b*1 and 24-*b*2 cause the interference of light with the VCSELs arranged in the light emission section 25 in the x-axis direction, the VCSELs 24-*b*1 and 24-*b*2 may be configured by a plurality of VCSELs having the controlled polarization direction so that the light intensity of the polarization component in the y-axis direction is smaller than the light intensity of the polarization component in the x-axis direction. In addition, since the VCSELs 24-*a*1 and 24-*a*2 cause the interference of light with the VCSELs arranged in the light emission section 26 in the y-axis direction, the VCSELs 24-*a*1 and 24-*a*2 may be configured by a plurality of VCSELs having the controlled polarization direction so that the light intensity of the polarization component in the x-axis direction is smaller than the light intensity of the polarization component in the y-axis direction. In addition, in a case where the light emission section 25 emits light immediately after the light emission section 24 and the light emission section 26 emits light after the light emission section 27, all VCSELs in the light emission section 24 may be configured with a plurality of VCSELs having the controlled polarization direction in consideration of only the interference between the light emission sections 24 and 25, so that the light intensity of the polarization component in the y-axis direction is smaller than the light intensity of the polarization component in the x-axis direction. The VCSEL 24-*ab* may be set to a VCSEL having a polarization direction controlled for the light emission section in which the interference is more likely to occur, or may be set to a VCSEL having a polarization direction that is not controlled. Although FIG. 10 illustrates an example in which one light emission section includes nine VCSELs, one light emission section may be configured to include 100 or more VCSELs. In a case where the number of VCSELs is increased in this manner, the degree of influence of VCSELs having a polarization direction that is not controlled is reduced.

Also, in the example in FIG. 10, the polarization direction may be controlled to reduce the occurrence of the interference within the light emission section 24. In a case where the interference of light occurs between the light emission sections 24 arranged in the x-axis direction, the light source 20 is configured by a plurality of VCSELs having the controlled polarization direction so that the light intensity of the polarization component in the y-axis direction is smaller than the light intensity of the polarization component in the x-axis direction. In addition, in a case where the interference of light occurs between the light emission sections 24 arranged in the y-axis direction, the light source 20 is configured by a plurality of VCSELs having the controlled polarization direction so that the light intensity of the polarization component in the x-axis direction is smaller than the light intensity of the polarization component in the y-axis direction. In the example in FIG. 10, as an example in which the interference of light in the light emission section is suppressed, an example in which the respective light emission sections such as the light emission section 24 and the light emission section 25 have different light emission timings is illustrated. The wavelength may be set to be different for each light emission section, the drive frequency may be set to be different from each light emission section.

Although the exemplary embodiment has been described above, the technology of the present disclosure is not limited to the scope described in the above exemplary embodiments.

For example, in the present exemplary embodiment, the case where the three-dimensional shape of the measurement target is specified by measuring the distance to the measurement target has been described. For example, the three-dimensional shape of the measurement target may be specified only by detecting whether or not there is the measurement target within a predetermined distance.

In the present exemplary embodiment, the example of the light emitting element array in which a plurality of VCSELs are arranged in both the first direction and the second direction has been described. The technique disclosed may be applied to, for example, a light emitting element array having a configuration in which a plurality of VCSELs are arranged only in one direction. In addition, in the fourth exemplary embodiment, the example of the light emitting element array in which light emission sections consisting of a plurality of VCSELs are arranged in both the first direction and the second direction has been described. The technique disclosed may be applied to a light emitting element array having a configuration in which light emission sections are arranged only in one direction, for example, a light emitting element array configured by the light emission sections 24, 25, and 27 in the example in FIG. 10.

Further, in the present exemplary embodiment, the example in which the technique disclosed is applied to the measurement apparatus that measures a three-dimensional shape has been described. The technique disclosed may also be applied to a configuration in which interference in a certain direction can be predicted in advance, among measurement apparatuses. For example, in a case where a distance to an obstacle in front of a vehicle during traveling is measured by attaching a measurement apparatus to the outer portion of the vehicle, and multipath from the road surface is a concern, a direction perpendicular to the road surface may be set to the first direction, and the horizontal direction with respect to the road surface may be set to the second direction, in consideration of an attachment direction in which the measurement apparatus is attached. With such a configuration, even in a case where the degree of reflection from the road surface, in particular, on a rainy day changes and the number of multipaths suddenly increases, the influence is suppressed.

Further, the technique disclosed may be applied to optical communication in which VCSELs are inserted into an optical waveguide such as an optical fiber. In a case where a plurality of VCSELs are inserted into separate optical fibers, the VCSELs inserted into the separate optical fibers may be regarded as light emitting elements in which the interference of light is suppressed. In this case, the polarization component may be controlled so that interference with other VCSELs inserted into the same optical fiber is less likely to occur.

In addition, the control unit 8 that measures the three-dimensional shape of the measurement target may be configured with a dedicated processor (for example, GPU: Graphics Processing Unit, ASIC: Application Specific Integrated Circuit, FPGA: Field Programmable Gate Array, programmable logic device, and the like), and may be incorporated in the optical device 3. In this case, the distance to the measurement target is measured by the optical device 3 alone.

In the present exemplary embodiment, the configuration in which the measurement program 16A is installed in the storage unit 16 has been described, but the present invention is not limited to this. The measurement program 16A according to the present exemplary embodiment may be provided in a mode in which the information processing program is recorded on a computer-readable storage medium. For example, the measurement program 16A according to the present exemplary embodiment may be provided in a form of being recorded in an optical disc such as a CD (Compact Disc)-ROM and a DVD (Digital Versatile Disc)-ROM, or semiconductor such as a universal serial bus (USB) memory and a memory card. Further, the measurement program 16A according to the present exemplary embodiment may be acquired from an external device via a communication line connected to the communication unit 14.

In the embodiments above, the term "processor" refers to hardware in a broad sense. Examples of the processor include general processors (e.g., CPU: Central Processing Unit) and dedicated processors (e.g., GPU: Graphics Processing Unit, ASIC: Application Specific Integrated Circuit, FPGA: Field Programmable Gate Array, and programmable logic device).

In the embodiments above, the term "processor" is broad enough to encompass one processor or plural processors in collaboration which are located physically apart from each other but may work cooperatively. The order of operations of the processor is not limited to one described in the embodiments above, and may be changed.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting element array comprising:

a plurality of light emitting elements, wherein, the plurality of light emitting elements are arranged in a first direction and a second direction intersecting with the first direction, among polarization components of light emitted by a light emitting element of the plurality of light emitting elements capable of causing interference of emitted light, a light intensity of a polarization component of light in the second direction is smaller than a light intensity of a polarization component in the first direction, wherein the light emitting elements arranged in the first direction emit light at the same light emission timing, and the light emitting elements arranged in the second direction emit light at timings different from each other, and the light emitting elements capable of causing the interference of the emitted light is arranged in the first direction.

2. The light emitting element array according to claim 1, wherein a distance between light emitting elements capable of causing the interference of the emitted light is shorter than a distance between light emitting elements other than the light emitting elements capable of causing the interference of the emitted light.

3. The light emitting element array according to claim 1, wherein the light emitting element capable of causing the interference of the emitted light is other than a light emitting element being a control target in which the interference of the emitted light is to be suppressed.

4. The light emitting element array according to claim 3, wherein, among a plurality of light emitting elements arranged in the first direction and the second direction, the light emitting elements arranged in the first direction emit light of the same wavelength, and the light emitting elements arranged in the second direction emit light of wavelengths different from each other, and the light emitting element capable of causing the interference of the emitted light is arranged in the first direction.

5. A light emitting device comprising:

the light emitting element array according to claim 4; and a drive unit that drives the light emitting element array such that interference of light is suppressed.

6. The light emitting element array according to claim 3, wherein, among a plurality of light emitting elements arranged in the first direction and the second direction, the light emitting elements arranged in the first direction are driven at the same drive frequency, and the light emitting elements arranged in the second direction are driven at drive frequencies different from each other, and the light emitting element capable of causing the interference of the emitted light is arranged in the first direction.

7. A light emitting device comprising:

the light emitting element array according to claim 6; and a drive unit that drives the light emitting element array such that interference of light is suppressed.

8. A light emitting device comprising:

the light emitting element array according to claim 3; and a drive unit that drives the light emitting element array such that interference of light is suppressed.

9. The light emitting element array according to claim 1, wherein the light emitting element capable of causing the interference of the emitted light is a control target in which the interference of the emitted light is to be suppressed.

10. The light emitting element array according to claim 9, wherein, among a plurality of light emitting elements arranged in the first direction and the second direction, the light emitting elements arranged in the first direction emit light at the same light emission timing, and the light emitting elements arranged in the second direction emit light at different timings, and the light emitting element capable of causing the interference of the emitted light is arranged in the second direction.

11. A light emitting device comprising:

the light emitting element array according to claim 10; and a drive unit that drives the light emitting element array such that interference of light is suppressed.

12. The light emitting element array according to claim 9, wherein, among a plurality of light emitting elements arranged in the first direction and the second direction, the light emitting elements arranged in the first direction emit light of the same wavelength, and the light emitting elements arranged in the second direction emit light of different wavelengths, and the light emitting element capable of causing the interference of the emitted light is arranged in the second direction.

13. The light emitting element array according to claim 9, wherein, among a plurality of light emitting elements arranged in the first direction and the second direction, the light emitting elements arranged in the first direction are driven at the same drive frequency, and the light emitting elements arranged in the second direction are driven at different drive frequencies, and the light emitting element capable of causing the interference of the emitted light is arranged in the second direction.

14. The light emitting element array according to claim 9, wherein, among a plurality of light emitting elements arranged in the first direction and the second direction, light emitting elements provided in the same light emission section emit light at the same light emission timing, and light emitting elements capable of causing the interference of the emitted light are provided in different light emission sections.

15. A light emitting device comprising:

the light emitting element array according to claim 9; and a drive unit that drives the light emitting element array such that interference of light is suppressed.

16. A detection apparatus comprising:

the light emitting element array according to claim 1;

a light receiving element array including a plurality of light receiving elements that receive reflected light of light emitted to a detection target object from the light emitting element array;

a drive unit that drives the light emitting elements; and a detection unit that detects the detection target object from an amount of light received by the plurality of light receiving elements.

17. The detection apparatus according to claim 16, wherein light emitted from the plurality of light emitting elements is received by the corresponding light receiving element.

18. The detection apparatus according to claim 16, wherein the detection unit detects a distance to the detection target object by time of flight.

* * * * *